United States Patent
Iwanaga et al.

(10) Patent No.: US 12,183,858 B2
(45) Date of Patent: Dec. 31, 2024

(54) LIGHT WAVELENGTH CONVERSION MEDIUM AND COMPOSITION FOR FORMING LIGHT WAVELENGTH CONVERSION MEDIUM

(71) Applicants: KABUSHIKI KAISHA TOSHIBA, Tokyo (JP); TOSHIBA INFRASTRUCTURE SYSTEMS & SOLUTIONS CORPORATION, Kawasaki (JP)

(72) Inventors: Hiroki Iwanaga, Yokohama Kanagawa (JP); Kenji Miyazaki, Tokyo (JP); Junichi Washizuka, Kawasaki Kanagawa (JP)

(73) Assignees: KABUSHIKI KAISHA TOSHIBA, Tokyo (JP); TOSHIBA INFRASTRUCTURE SYSTEMS & SOLUTIONS CORPORATION, Kawasaki (JP)

(*) Notice: Subject to any disclaimer, the term of this patent is extended or adjusted under 35 U.S.C. 154(b) by 800 days.

(21) Appl. No.: 17/198,657

(22) Filed: Mar. 11, 2021

(65) Prior Publication Data
US 2022/0085252 A1    Mar. 17, 2022

(30) Foreign Application Priority Data
Sep. 15, 2020 (JP) .................. 2020-154829

(51) Int. Cl.
*H01L 33/50* (2010.01)
*C09K 11/06* (2006.01)

(52) U.S. Cl.
CPC ............ *H01L 33/502* (2013.01); *C09K 11/06* (2013.01); *C09K 2211/182* (2013.01); *H01L 2933/0041* (2013.01)

(58) Field of Classification Search
CPC ......... H01L 33/502; H01L 2933/0041; C09K 11/06; C09K 2211/182; C07F 9/5345
USPC .............................................. 428/1.3; 257/79
See application file for complete search history.

(56) References Cited

U.S. PATENT DOCUMENTS

| 7,250,117 | B2 | 7/2007 | Iwanaga | |
| 2006/0063036 | A1* | 3/2006 | Iwanaga | C09D 11/50 |
| | | | | 428/690 |
| 2011/0057150 | A1* | 3/2011 | Iwanaga | C09K 11/06 |
| | | | | 252/301.16 |
| 2021/0071073 | A1 | 3/2021 | Iwanaga et al. | |

FOREIGN PATENT DOCUMENTS

| JP | 2005-15564 A | 1/2005 |
| JP | 3811142 B2 | 8/2006 |
| JP | 2021-042134 A | 3/2021 |

OTHER PUBLICATIONS

Iwanaga, "Emission Properties, Solubility, Thermodynamic Analysis and NMR Studies of Rare-Earth Complexes with Two Different Phosphine Oxides", Materials 2010, 3(8), 4080-4108.

* cited by examiner

Primary Examiner — Ruiyun Zhang
(74) Attorney, Agent, or Firm — Foley & Lardner LLP

(57) ABSTRACT

The present embodiments provide a light wavelength conversion medium excellent in emission intensity and durability, and also a light wavelength conversion medium-forming composition used for forming that medium. The conversion medium according to the embodiment comprises a rare earth complex comprising a rare earth ion and a nonionic ligand, a nonionic compound substitutable for the nonionic ligand, and a polymer or a solvent.

20 Claims, 3 Drawing Sheets

LIGHT WAVELENGTH CONVERSION MEDIUM AND COMPOSITION FOR FORMING LIGHT WAVELENGTH CONVERSION MEDIUM

CROSS-REFERENCE TO RELATED APPLICATIONS

This application is based upon and claims the benefit of priority from the prior Japanese Patent Application No. 2020-154829, filed on Sep. 15, 2020, the entire contents of which are incorporated herein by reference.

FIELD

Embodiments of the present disclosure relate to a light wavelength conversion medium excellent in emission intensity and durability, and also to a light wavelength conversion medium-forming composition used for forming that medium.

BACKGROUND

Rare earth complexes characteristically absorb light in the UV wavelength region and exhibit sharp emission spectra, and it is hoped that they will be exploited in many fields, such as, light-emitting devices, sensors, security media, and ornaments. In order to employ rare earth complexes for light wavelength conversion media, they are required to be excellent in emission intensity, solubility in polymers and solvents, and durability. Complexes having those favorable properties have been under research and development.

DETAILED DESCRIPTION

Figure 1:
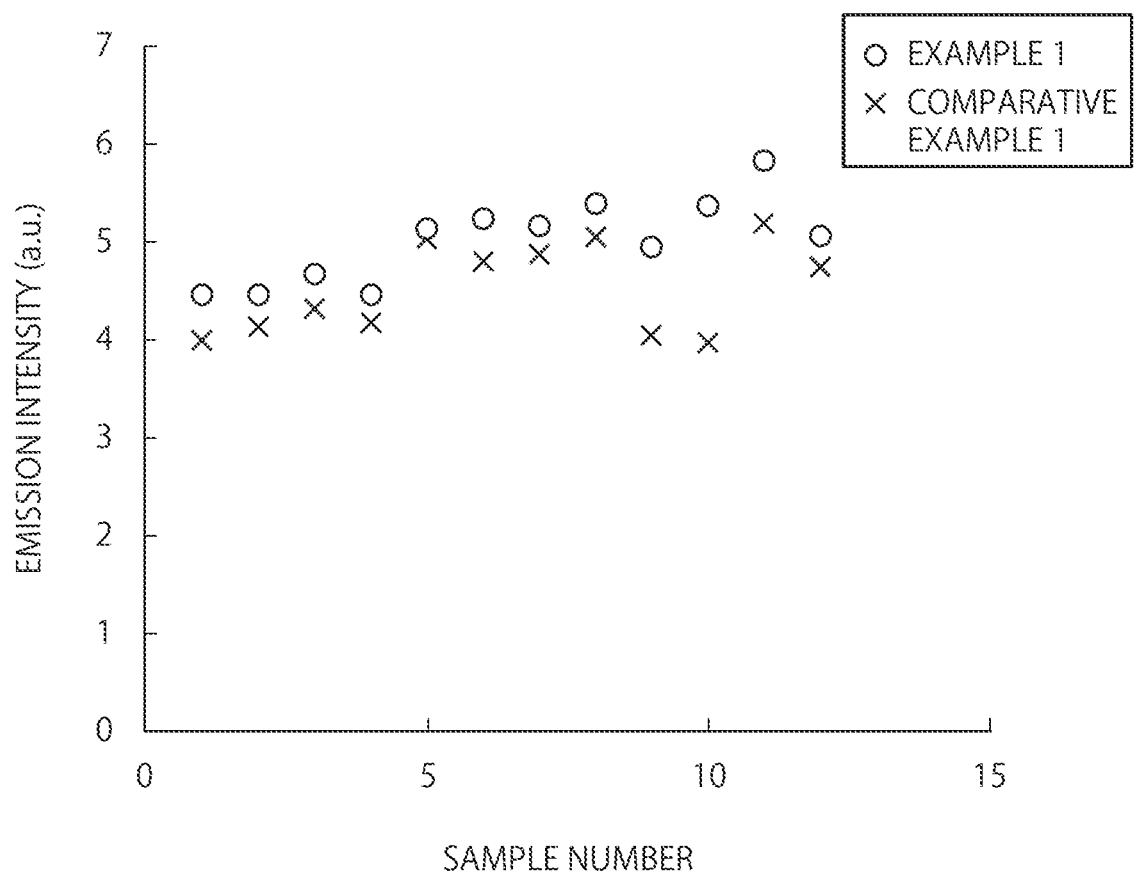
FIG. 1 is a graph for comparing emission intensities of the light wavelength conversion media in Example 1 and Comparative example 1.

A light wavelength conversion medium according to the embodiment comprises:
  a rare earth complex comprising a rare earth ion and a nonionic ligand,
  a nonionic compound substitutable for said nonionic ligand, and
  a polymer or a solvent.

Further, a light wavelength conversion medium-forming composition according to the embodiment comprises:
  a rare earth complex comprising a rare earth ion and a nonionic ligand,
  a nonionic compound substitutable for said nonionic ligand, and
  a polymer or a solvent.

Embodiments will now be explained with reference to the accompanying drawings.

<Light Wavelength Conversion Medium>

When the light wavelength conversion medium according to the embodiment is exposed to UV light, the rare earth complex contained in the medium absorbs the UV light and emits light at a wavelength different from that of the absorbed UV light. The rare earth complex is colorless and transparent under room light but strongly emits light under UV or near UV light irradiation, and hence is hard to perceive under normal conditions but emits enough light to perceive when irradiated with particular light. Accordingly, the light wavelength conversion medium comprising the complex can be employed as security medium used for watermark printing on certificates and securities. Specifically, for example, the medium can be used as an ink for printing bar-codes to ensure higher security because it is difficult under visible light irradiation even to know there are bar-codes thereon.

The light wavelength conversion medium generally comprises a complex and a polymer. In addition, the conversion medium according to the embodiment comprises
  a rare earth complex comprising a rare earth ion and a nonionic ligand,
  a nonionic compound substitutable for said nonionic ligand, and
  a polymer or a solvent.

This medium may be a molding of the mixture itself comprising the above components, may be a film formed on a desired planer substrate, or may be soaked in a fibrous substrate.

In the light wavelength conversion medium according to the embodiment, the rare earth complex (hereinafter, often simply referred to as "complex") and the nonionic compound are dissolved or dispersed in the polymer or the solvent. The complex comprises a nonionic compound as a ligand in its molecule. The complex is basically stable, but the ligand often dissociates when the complex is dissolved in a polymer or a solvent. In that case, if another nonionic compound having a structure similar to the nonionic ligand is present near the complex, the compound and the dissociated ligand can be substituted for each other. The complex, the nonionic compound and the polymer are explained below.

<Rare Earth Complex>

The rare earth complex according to the embodiment comprises a rare earth ion and a nonionic ligand. This complex absorbs light and emits light. Specifically, the rare earth complex absorb UV light, near-UV light (400 to 430 nm) and blue light (nearly 464 nm, correspond to $^7F_0$ to $^5D_2$ transition array of Eu (III) ion) and emits light.

In the embodiment, the rare earth ion can be so selected as to give off emission at the wavelength appropriate to the aimed application, but is preferably a lanthanide ion. Specifically, europium (III) ion and terbium (III) ion are preferred, and europium (III) ion is particularly preferred in view of obtaining a complex showing such a large spectrum in the red region as realizes excellent color rendering properties.

The complex having the above rare earth ion further comprises a counter ion (anion), which forms an ionic bond with the rare earth ion, and a nonionic ligand, which form a coordinate-bond with the rare earth ion.

The nonionic ligand is a compound having an unpaired electron, and does not generate a cation or an anion when dissolved in water or the like. The nonionic ligand is preferably selected from the group consisting of phosphine oxide compounds, sulfoxide compounds, and amine compounds. Those compounds contains bonds having unpaired electrons, such as P=O bonds or S=O bonds, which can form coordinate-bonds with the rare earth ion. The rare earth ion has plural coordination sites, and hence it is also preferred to adopt a compound having plural bonds having unpaired electrons. Those compounds combines with the rare earth ion as multidentate ligands.

Preferred examples of the nonionic ligand include the following (L-1-1) to (L-3-2):

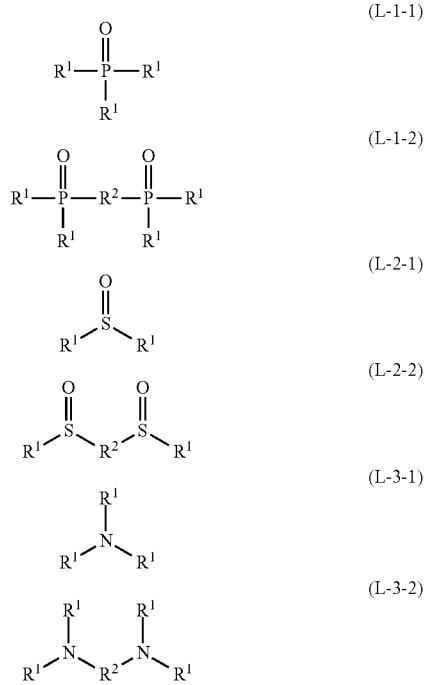

wherein
- each $R^1$ is independently a substituted or unsubstituted alkyl group or a substituted or unsubstituted aryl group provided that two $R^1$s connecting to a phosphorus, sulfur or nitrogen atom may be linked with each other to form an alicyclic or aromatic ring structure, and
- each $R^2$ is a substituted or unsubstituted alkylene or a substituted or unsubstituted arylene group.

The "alkyl group" here means not only a group consisting of only carbon and hydrogen atoms but also a group having a substituent containing an oxygen, nitrogen or sulfur atom, such as, hydroxy or amino group. Also, the "aryl group" in the embodiment may be a group in which the aromatic ring contains a nitrogen or sulfur atom as a ring member. For example, the aryl group may be a pyridyl group or a thienyl group. Further, the aryl group may have a substituent containing an oxygen, nitrogen or sulfur atom, such as, hydroxy or amino group.

Specifically, $R^1$ is preferably an alkyl group having 3 to 10 carbon atoms, a fluoroalkyl group having 3 to 10 carbon atoms, an aryl group having 5 to 20 carbon atoms, an fluoroaryl group having 5 to 20 carbon atoms, an alkylaryl group having 6 to 20 carbon atoms, an alkoxylaryl group having 6 to 20 carbon atoms, a heteroaryl group having 5 to 20 carbon atoms or a fluoroaryl group having 6 to 20 carbon atoms; more preferably an alkyl group having 4 to 8 carbon atoms, a fluoroalkyl group having 4 to 8 carbon atoms, an aryl group having 6 to 10 carbon atoms, an fluoroaryl group having 6 to 10 carbon atoms, an alkylaryl group having 7 to 12 carbon atoms, an alkoxylaryl group having 7 to 12 carbon atoms, a heteroaryl group having 6 to 10 carbon atoms or a fluoroaryl group having 6 to 10 carbon atoms. Furthermore, it is preferred that at least one $R^1$ is a substituted phenyl having a substituent in ortho-position. If the complex has such ortho-position substituted phenyl, the durability of the complex is improved. It is more preferred that all $R^1$ are substituted phenyl having a substituent in ortho-position.

Also, $R^2$ is preferably an alkylene group having 2 to 8 carbon atoms or an arylene group having 6 to 15 carbon atoms. In $R^2$, the number of atoms sandwiched between two phosphorus, sulfur or nitrogen atoms is preferably 2 to 5. Typically, $R^2$ is an alkylene group having 3 to 5 carbon atoms.

Further, $R^1$ and $R^2$ may have straight-chain structures, branched-chain structures or cyclic structures. Any $R^1$ may link with $R^2$ or another $R^1$ to form a heteroalicyclic or heteroaromatic ring containing a phosphorus, sulfur or nitrogen atom.

Among the above, phosphine oxide-containing ligands (L-1-1) and (L-1-2) are preferred and diphosphine dioxide ligand (L-1-2), or tetraphosphine dioxide (L-1-3) or (L-1-4) are more preferred.

In the above ligands, (L-1-2), (L-2-2) and (L-3-2) preferably have asymmetrical shapes. For example, in the ligand (L-1-2), when the substituent set connecting to one phosphorus atom is different from that connecting to the other phosphorus atom, the ligand is asymmetrical. Such asymmetrical bidentate ligand having two unpaired electrons makes the ligand field asymmetrical and thereby enhances the quantum yield. The emission intensity of the complex is proportional to the product of the quantum yield and the absorption coefficient, and hence the higher the quantum yield is, the more the emission intensity can be enhanced. In addition, if being asymmetrical, the diphosphine dioxide ligand tends to have high solubility in solvents. For the purpose of making the bidentate ligand asymmetrical, it is possible to combine aliphatic hydrocarbon groups having different numbers of carbon atoms. However, in view of enhancing distortion of the ligand field, the asymmetry is preferably realized by combination of aliphatic hydrocarbon groups and aromatic ones. For example, in the ligand (L-1-2), it is preferred that at least one aliphatic hydrocarbon group is connected to one of the two phosphorus atoms while at least one aromatic hydrocarbon group is connected to the other, and it is particularly preferred that two aliphatic hydrocarbon groups are connected to one phosphorus atom while two aromatic hydrocarbon groups are connected to the other.

The following are concrete examples of the nonionic ligand preferably used in the embodiment:

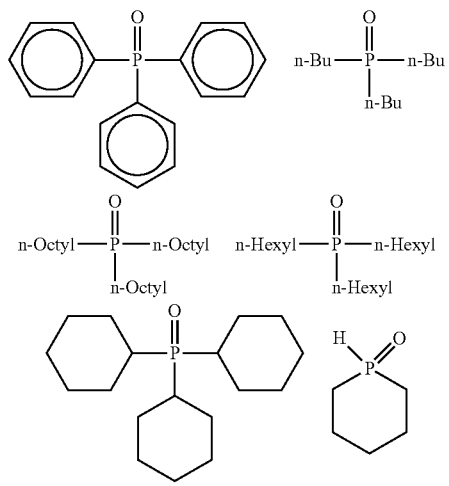

-continued
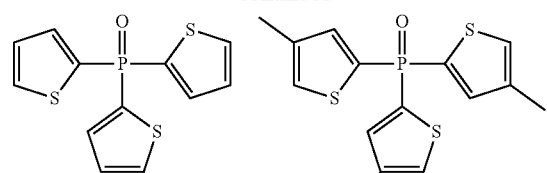
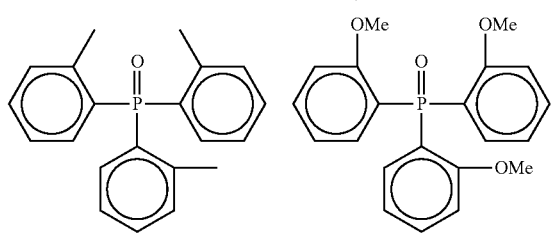
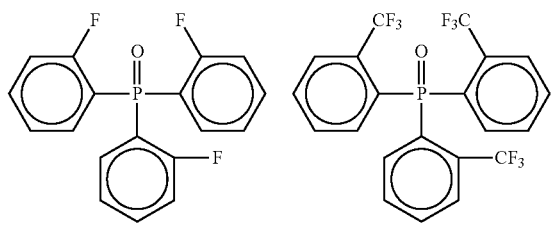
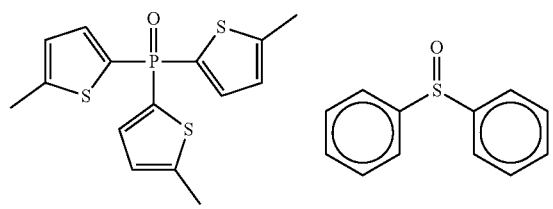
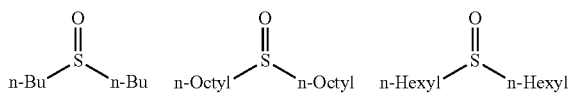
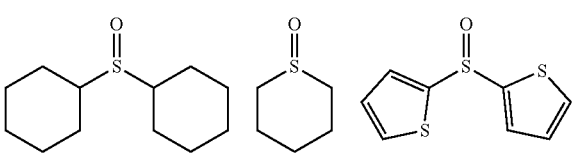
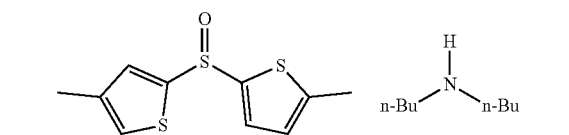
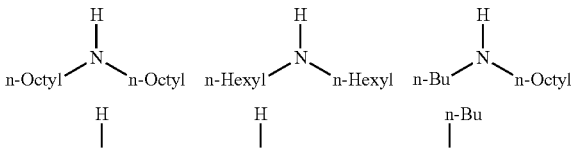
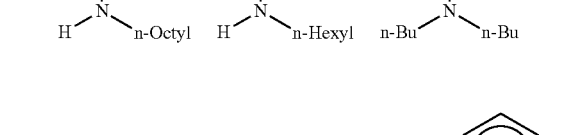
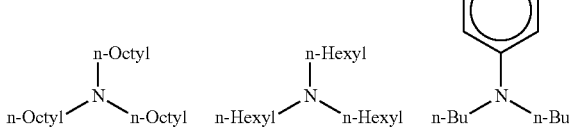
-continued
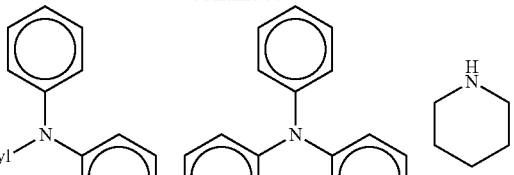
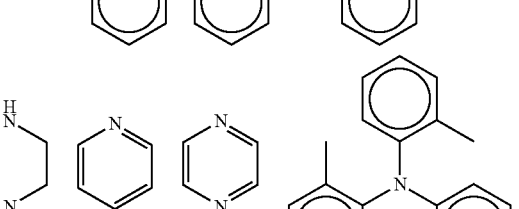
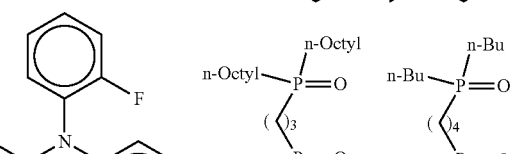
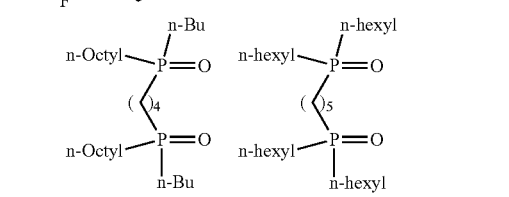
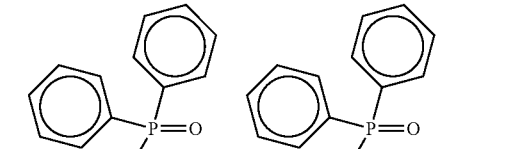
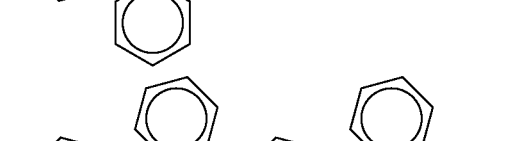
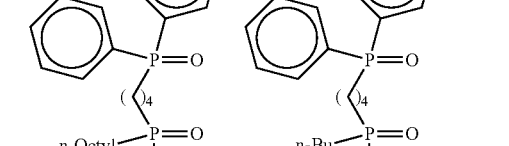
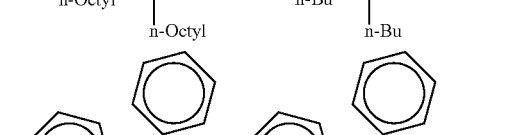
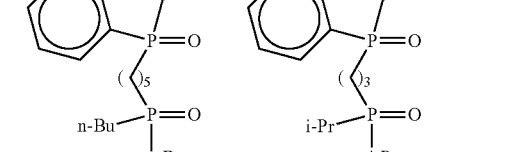

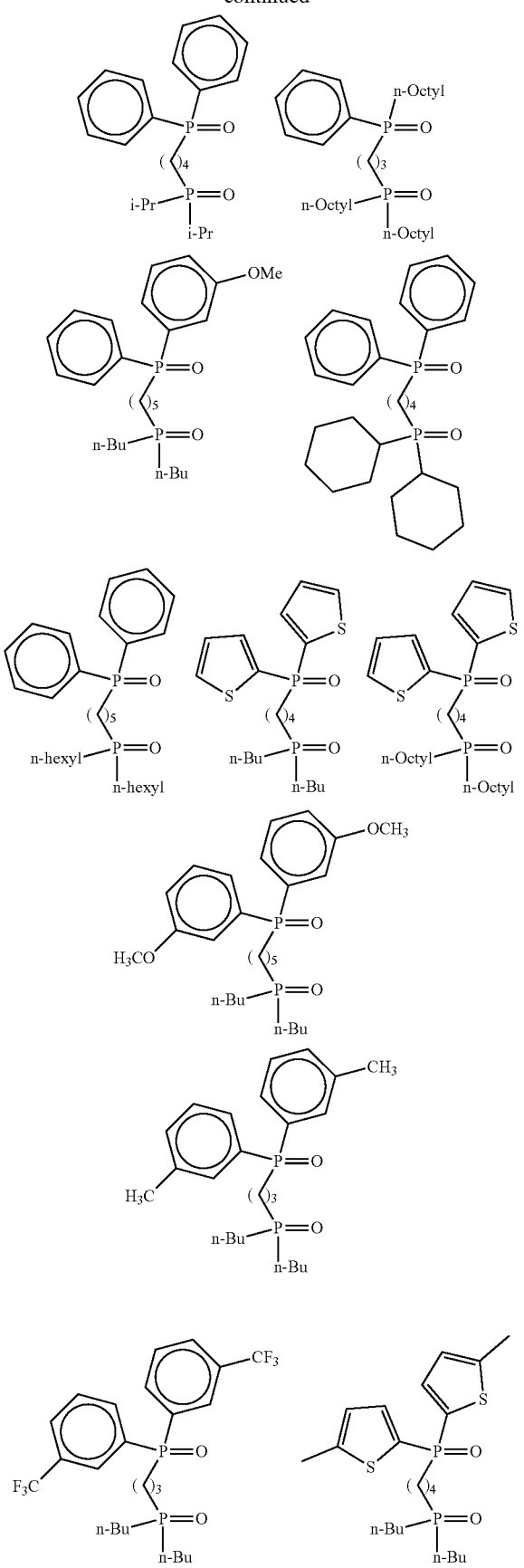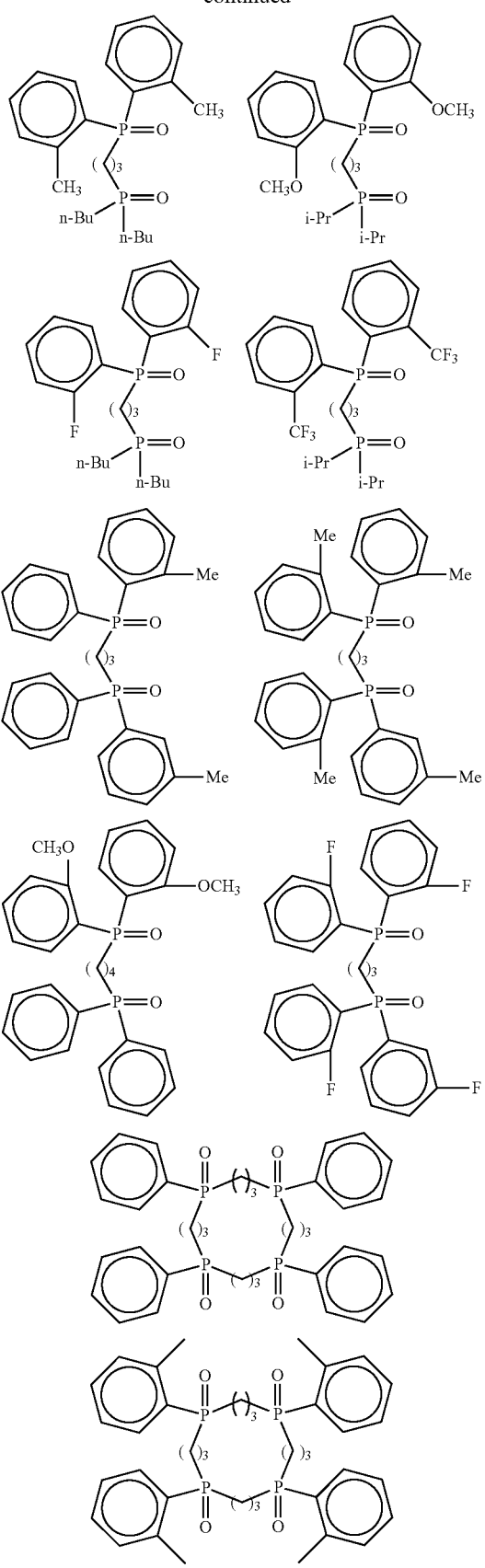

-continued

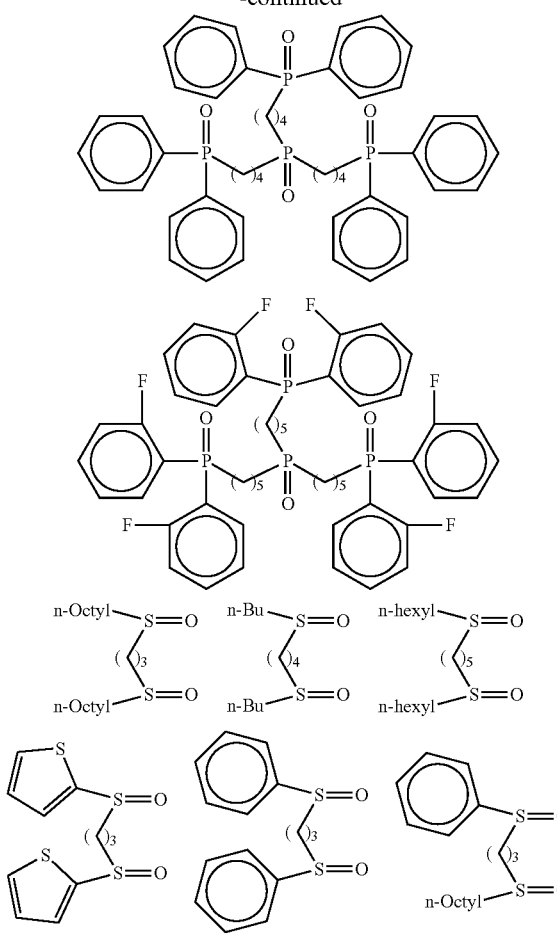
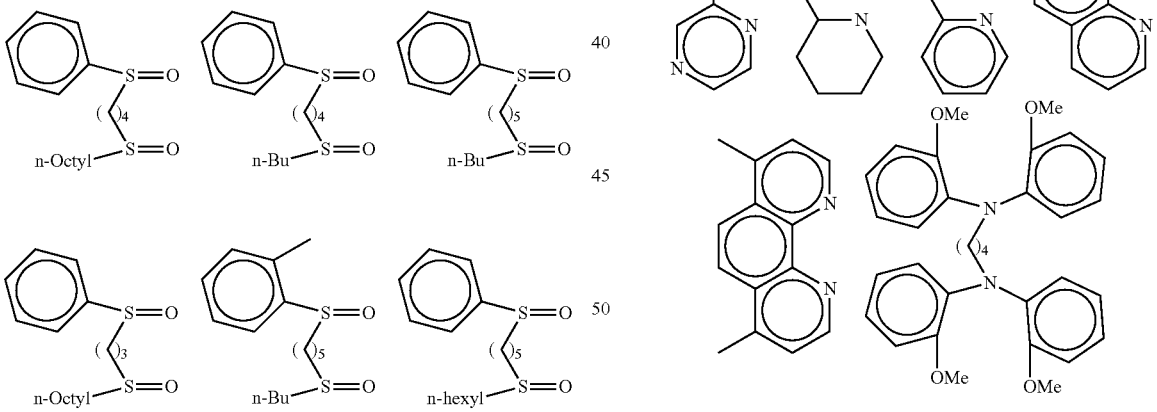
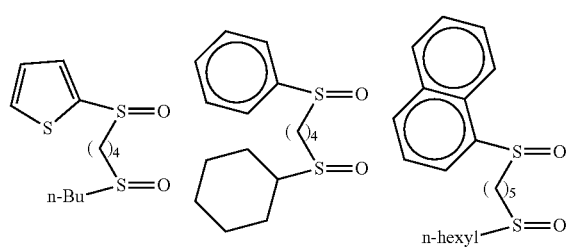

Further, the rare earth complex comprises a desired anion as a counter ion. There are no particular restrictions on the anion, and it may be a halogen or acid ion originating from a rare earth metal salt adopted as a material of the complex or a particular anion for improving properties of the complex.

As the anion for improving properties of the complex, a β-diketonate ligand can be used. The β-diketonate ligand can be freely selected from known ones. The β-diketonate ligand not only serves as a counter ion to the cationic rare earth ion, but also contributes to formation of the ligand field in the complex. In the embodiment, a particular β-diketonate ligand can realize high durability of the rare earth complex.

A β-diketonate ligand is an ionic ligand formed by eliminating a hydrogen atom from a β-diketonate compound. The β-diketonate compound has keto-enol tautomerism, but can be represented by, for example, the following formula (K):

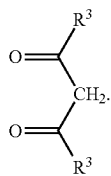

(K)

In the above formula, each $R^3$ is independently a substituted or unsubstituted alkyl group or a substituted or unsubstituted aryl group, preferably a halogen-substituted alkyl group. Specifically, each $R^3$ is preferably an alkyl group having 1 to 10 carbon atoms, a halogenated alkyl group having 1 to 10 carbon atoms, a phenyl group, an alkylphenyl group having 7 to 10 carbon atoms, or a halogenated alkylphenyl group having 7 to 10 carbon atoms. Among them, each $R^3$ is preferably a fluoroalkyl group having 1 to 10 carbon atoms, more preferably a fluoroalkyl group having 1 to 4 carbon atoms.

The complex of the embodiment preferably has a β-diketonate ligand, which is an ionic ligand formed by eliminating a hydrogen atom from the above β-diketonate compound.

In the embodiment, the β-diketonate ligand preferably has a halogenated alkyl group because it enhances the emission intensity. That is because of the following reason: The halogenated alkyl group is electron-attractive and accordingly reduces the energy difference (ΔE) between the excited triplet state of the β-diketonate ligand and the excited state level $^5D_0$ or $^5D_1$ of the rare earth (III) ion, so as to increase the efficiency of energy transfer from the ligand to the rare earth (III) ion. This linking group generally connects to the 1- and/or 3-position of the β-diketonate ligand skeleton. Further, if the β-diketonate ligand has an asymmetrical shape, the emission intensity tends to be enhanced.

The following are examples of β-diketonate compounds serving as precursors of the above β-diketonate ligand:

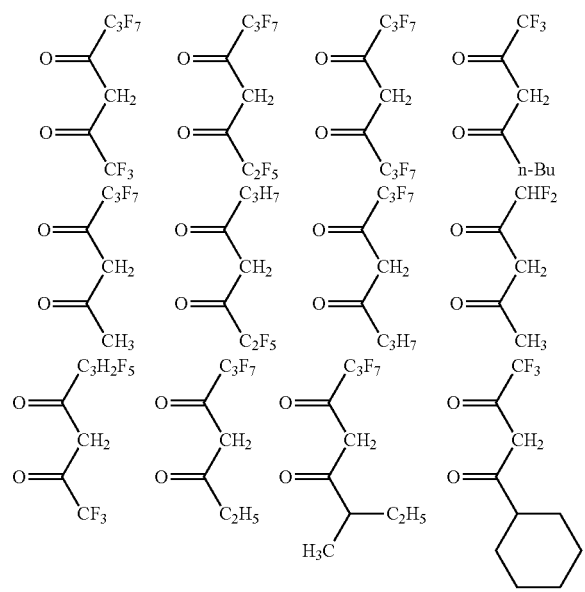

-continued

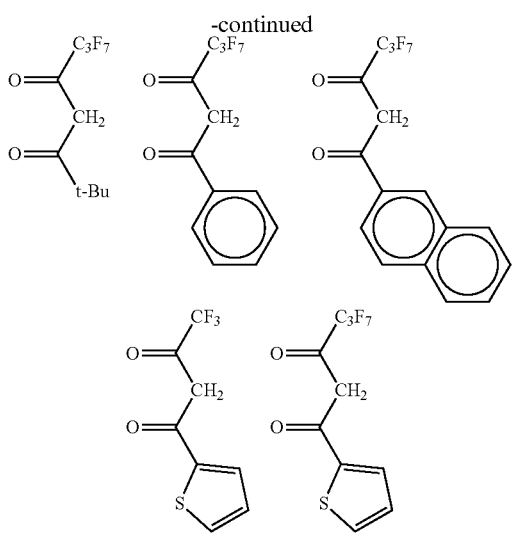

The complex according to the embodiment preferably contains the β-diketonate ligand as a counter ion to the rare earth ion, but may contain other anions as the counter ion. Example of those anions include halogen ions, hydroxy ion and carboxylate ion.

The rare earth complex of the embodiment preferably comprises the above-described rare earth ion, nonionic ligand and ionic ligand, and if necessary other components can be incorporated. Specifically, the complex is preferably represented by the following formula (1):

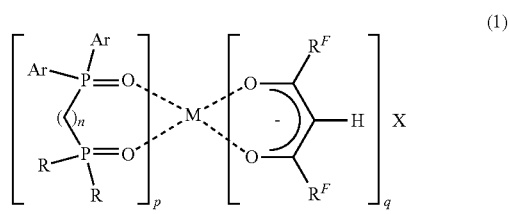

(1)

wherein
each Ar is independently an aryl group,
each R is independently an alkyl group,
each $R^F$ is independently a halogenated hydrocarbon group,
n is an integer of 3 to 5,
p is an integer of 1 or 2,
q is an integer of 1 to 3,
M is a rare earth ion, and
X is absent when q is 3 but is an anion having a valence of 3-q when q is 1 or 2.

The two aryl (Ar) groups in the formula (1) may be the same as or different from each other. There are no particular restrictions on the aryl group, but the number of carbon atoms contained therein is preferably 5 to 20, more preferably 5 to 12, in view of the solubility and durability of the complex. The aryl group may have substituents such as hydroxy and alkoxy groups and also may contain a hetero atom in the ring as long as they do not impair the effect of the embodiment. Specifically, the aryl group is preferably phenyl, 2-methylphenyl, 1-ethoxyphenyl, naphthyl or thienyl, more preferably phenyl. If the aryl group is a phenyl group having a substituent at the 2-position, the solubility tends to be enhanced. The two Ar groups may link together to form a cyclic structure containing the phosphorus atom. Specifically, for example, the complex may have a structure in which phenylene groups connect with a phosphorus atom via two hydrocarbon chains.

In the formula (1), the two alkyl (R) groups may be the same as or different from each other. There are also no particular restrictions on the alkyl group, but the number of carbon atoms contained therein is preferably 3 to 10, more preferably 4 to 8, in view of the solubility and durability of the complex. The alkyl group may have substituents such as hydroxy and alkoxy groups as long as they do not impair the effect of the embodiment. Specifically, examples of the alkyl group include n-butyl, 1-methylpropyl, t-butyl, n-hexyl, 2-ethylbutyl, and n-octyl. The two R groups may link together to form a cyclic structure containing the phosphorus atom. Specifically, for example, the complex may have a structure in which alkylene chains, particularly alkylene chains of 3 to 10 carbon atoms connect with one phosphorus atom to form a heterocyclic ring.

The two phosphorus atoms in the formula (1) link together via an alkylene chain having n carbon atoms. The integer n is 3 to 5, preferably 4. For realizing high durability, the integer n must be within that range. If it is 2 or less, the positional relation between the two phosphine oxides is restricted, so that the coordination bond of the diphosphine dioxide ligand is weakened and consequently the emission intensity is lowered. On the other hand, if the integer n is more than 5, the diphosphine dioxide ligand may singly connect with two rare earth ions to form a binuclear complex, which lowers the solubility.

The β-diketonate ligand in the formula (1) has two halogenated hydrocarbon groups $R^F$s at the 1- and 3-positions. Since the β-diketonate ligand has halogenated hydrocarbon groups, when the complex absorbs light, energy can transfer from the excited ligand to the rare earth ion with such high efficiency as to realize high emission intensity. There are no particular restrictions on how many carbon atoms the halogenated hydrocarbon group has, but it preferably has 8 or less, more preferably 1 to 3 carbon atoms in view of realizing high solubility. Specifically, the halogenated hydrocarbon group is preferably a perfluoroalkyl group, particularly preferably $CF_3$, $C_2F_5$ or $C_3F_7$. The two $R^F$s may be the same as or different from each other, but are preferably different so that the β-diketonate ligand may be asymmetrical to increase the ligand field distortion enough to enhance the emission intensity.

It is generally known that complexes are improved in light resistance and quantum yield if the two substituents of the β-diketonate ligand are perfluoroalkyl groups. On the other hand, however, it is also known that complexes having that structure have poor solubility in polymers and/or solvents and hence that compositions comprising those complexes (i.e., solutions of the complexes dissolved in polymers and/or solvents) often have poor transparency. The compositions poor in transparency are unfavorable particularly for application to security media. In the embodiment, the diphosphine dioxide ligand has such a particular structure as to realize both high solubility of the complex and high transparency of the composition thereof.

The complex represented by the formula (1) has p diphosphine dioxide ligands and q β-diketonate ligands provided that p is an integer of 1 or 2 and q is an integer of 1 to 3. The most typical complex has one diphosphine dioxide ligand (p=1) and three diketonate ligands (q=3) and hence has an 8-coordinate structure. In this case, the charge of the rare earth ion is cancelled out with three β-diketonate ligands and accordingly the counter ion X is absent.

The complex may have two or less β-diketonate ligands. In that case, two diphosphine dioxide ligands can generally coordinate but the counter ion X is necessary so as to cancel out the charge of the whole complex. That counter ion may be either one divalent anion or a set of two monovalent anions.

The complex according to the embodiment may further contain a ligand other than the diphosphine dioxide ligand or the β-diketonate ligand as long as the effect of the embodiment is not impaired.

Examples of the complex according to the embodiment include the following (1-1) to (1-58). Among them, (1-1) to (1-16), and (1-48) to (1-58) are preferred and (1-1) to (1-11) are more preferred.

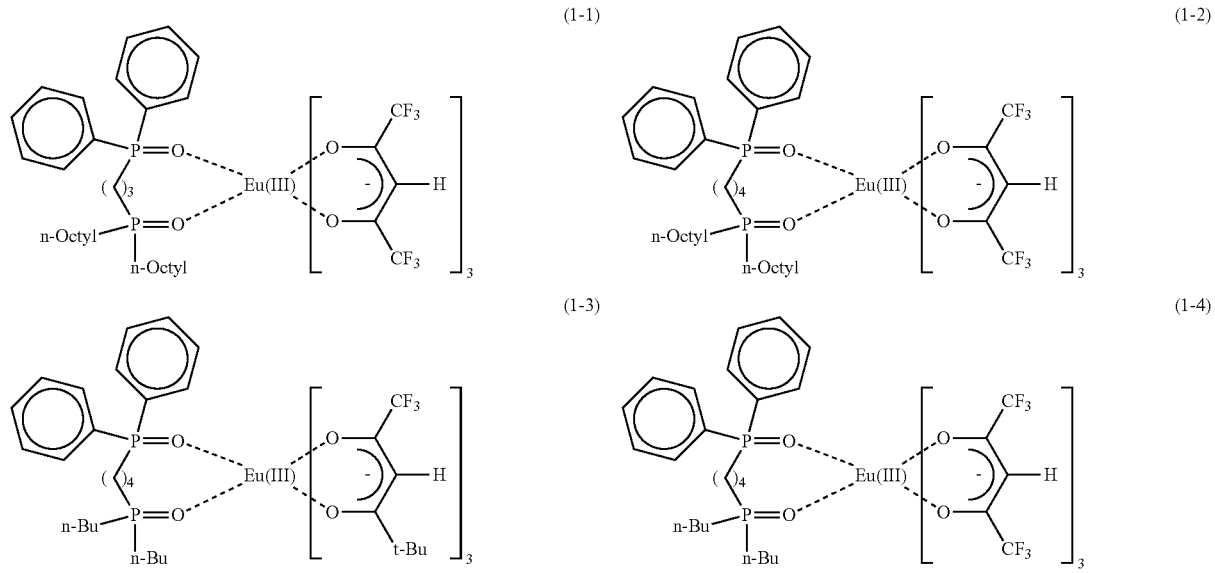

-continued
(1-5)
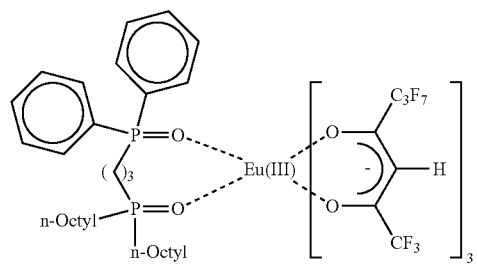
(1-6)
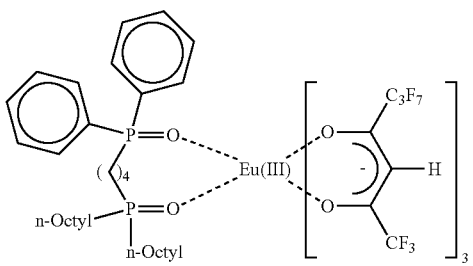
(1-7)
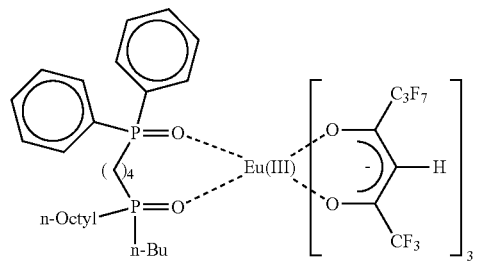
(1-8)
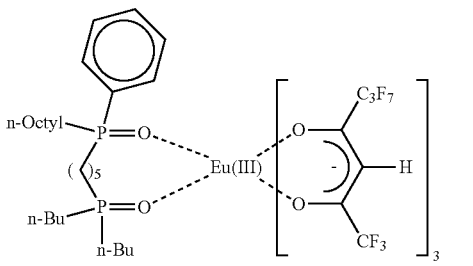
(1-9)
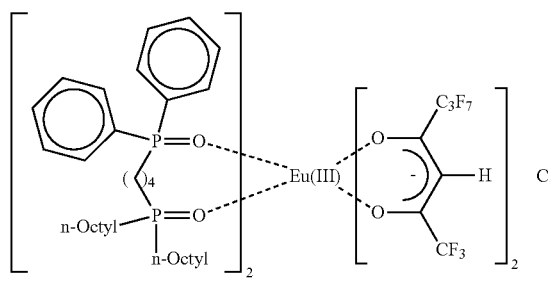
(1-10)
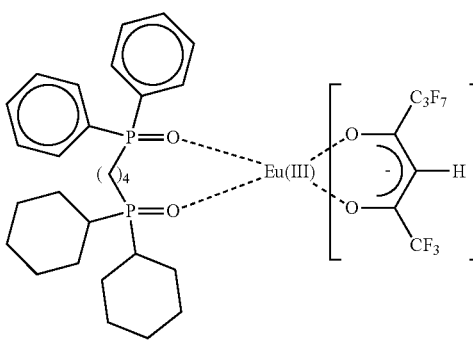
(1-11)
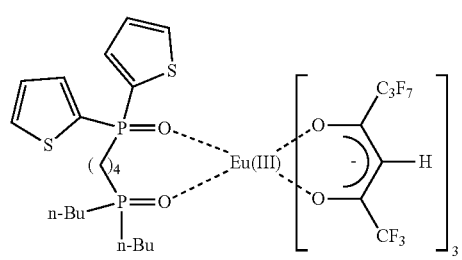
(1-12)
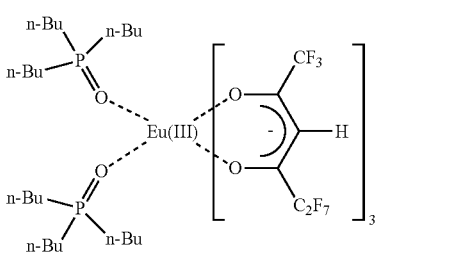
(1-13)
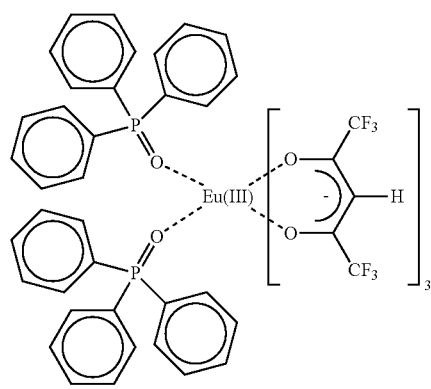
(1-14)
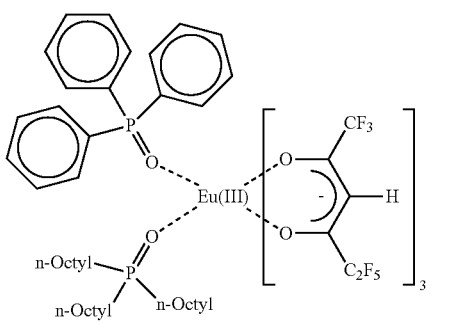

-continued
(1-15)
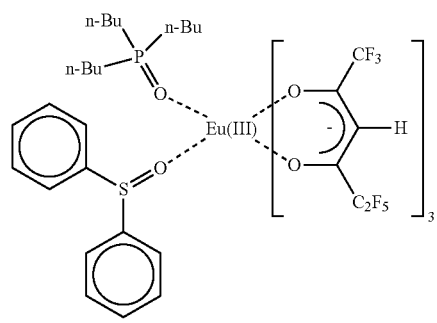
(1-16)
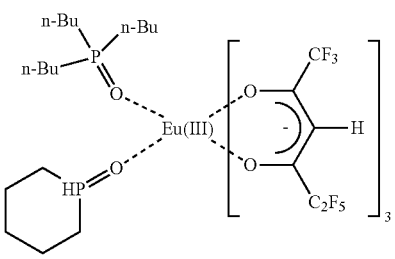
(1-17)
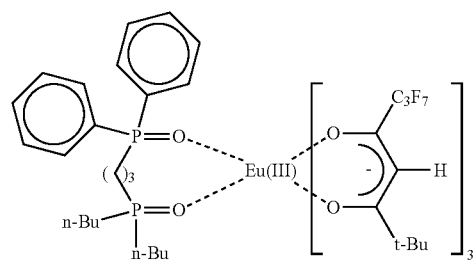
(1-18)
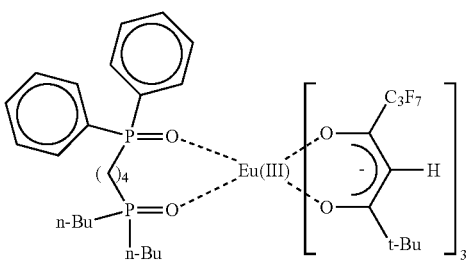
(1-19)
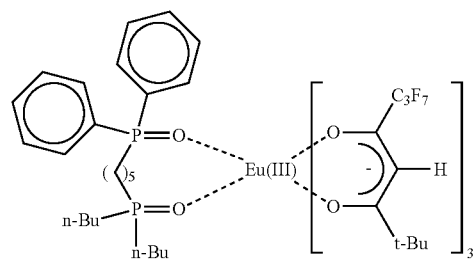
(1-20)
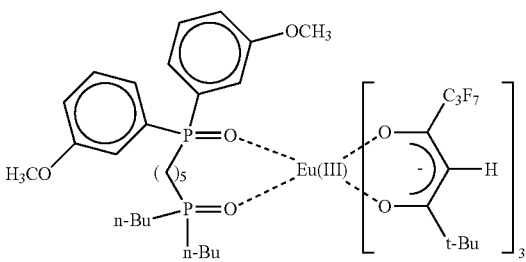
(1-21)
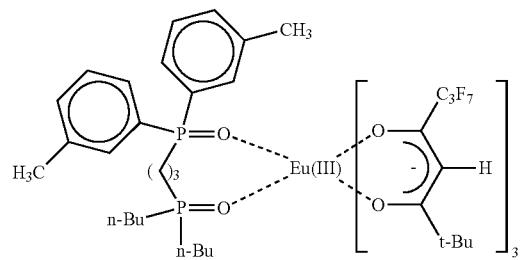
(1-22)
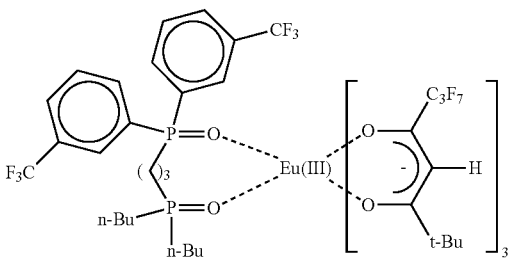
(1-23)
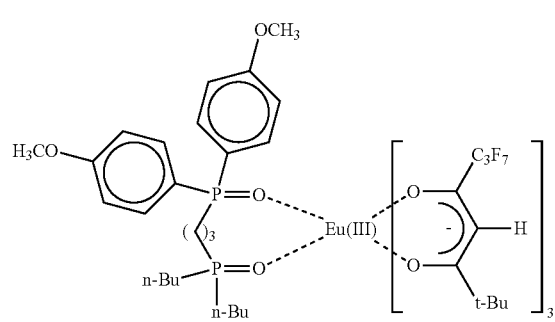
(1-24)
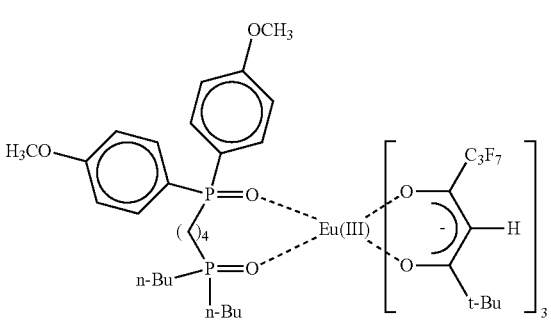

-continued
(1-25)
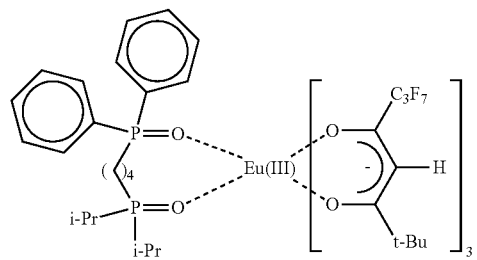
(1-26)
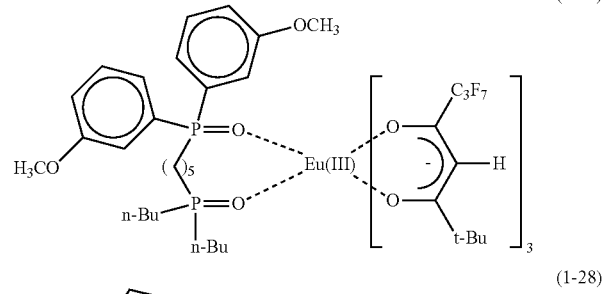
(1-27)
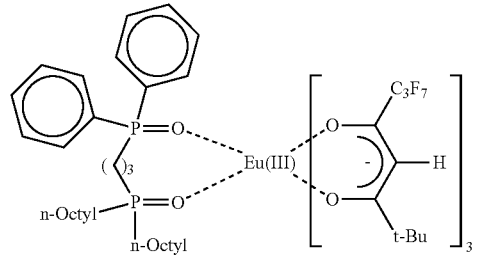
(1-28)
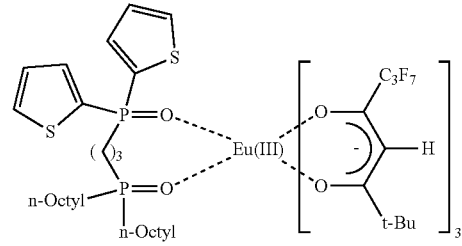
(1-29)
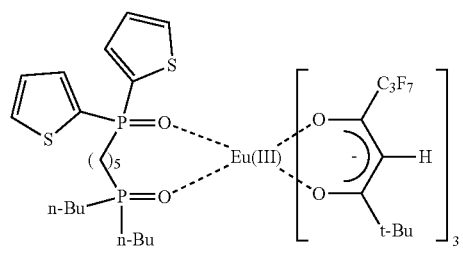
(1-30)
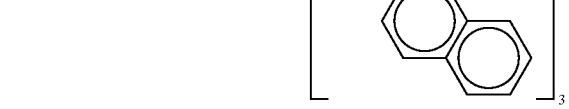
(1-31)
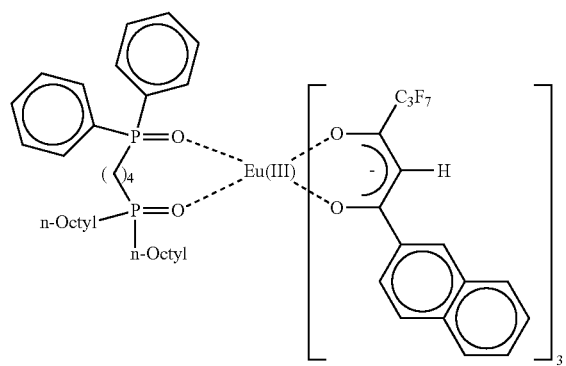
(1-32)
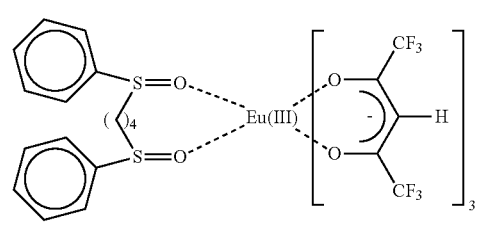
(1-33)
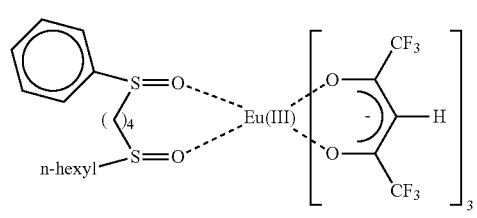
(1-34)

-continued
(1-35)
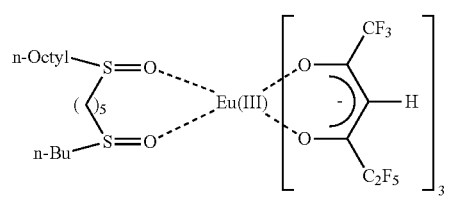
(1-36)
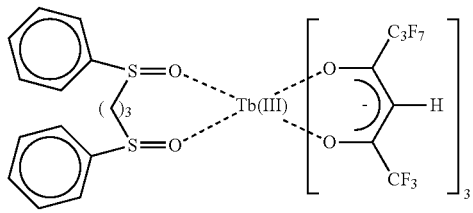
(1-37)
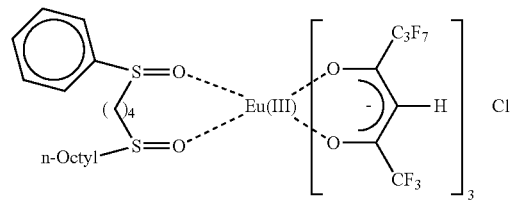
(1-38)
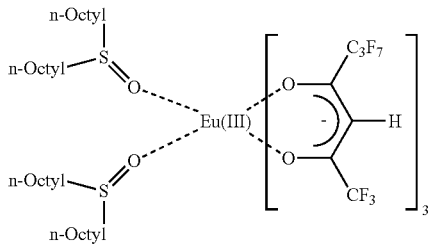
(1-39)
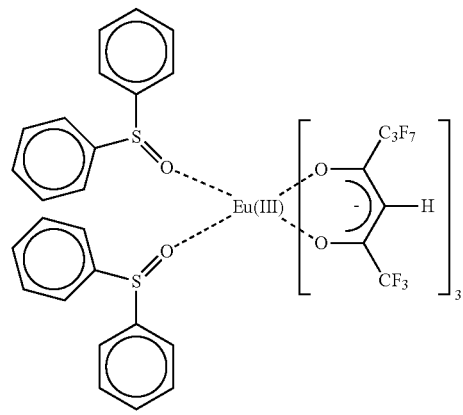
(1-40)
(1-41)
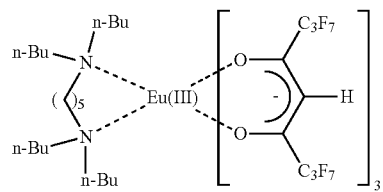
(1-42)
(1-43)
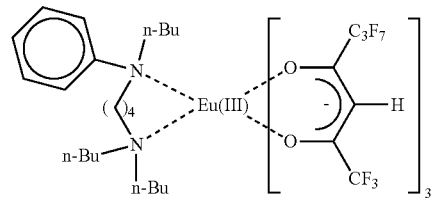
(1-44)
(1-45)
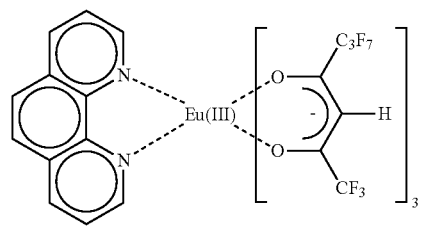
(1-46)
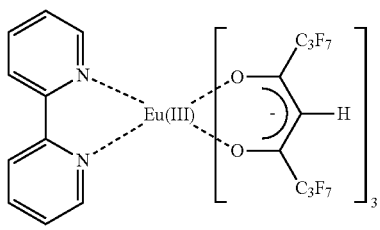

-continued
(1-47)
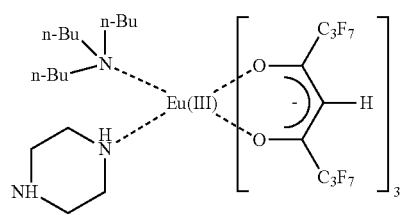
(1-48)
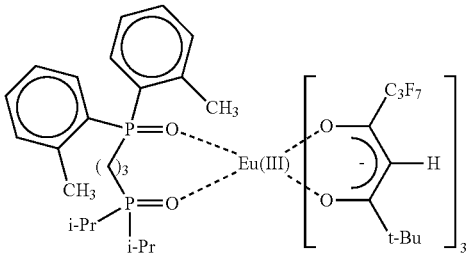
(1-49)
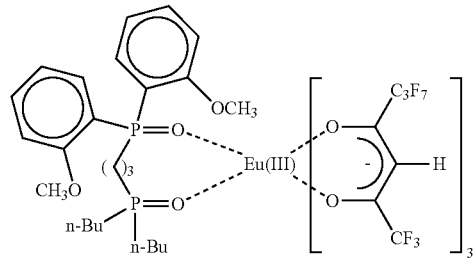
(1-50)
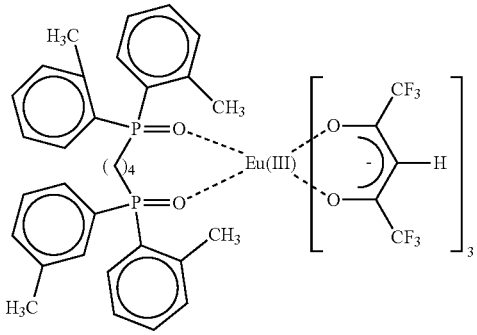
(1-51)
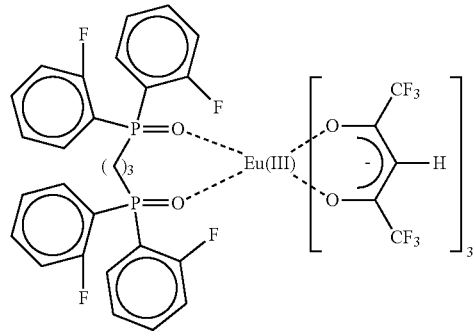
(1-52)
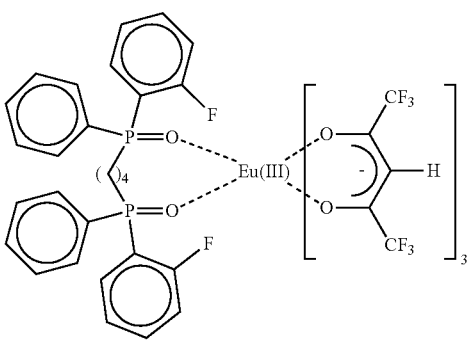
(1-53)
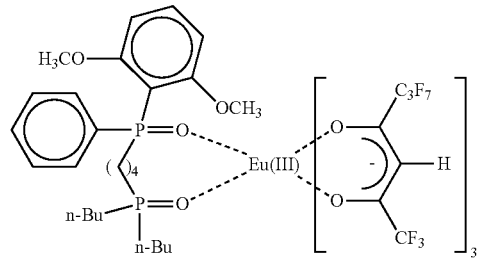
(1-54)
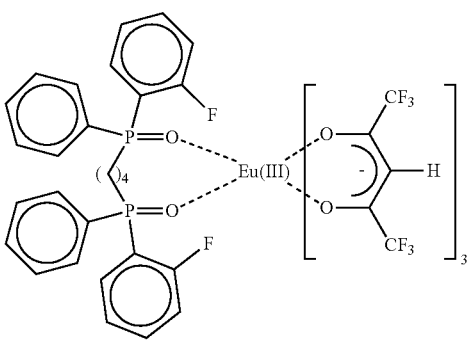
(1-55)
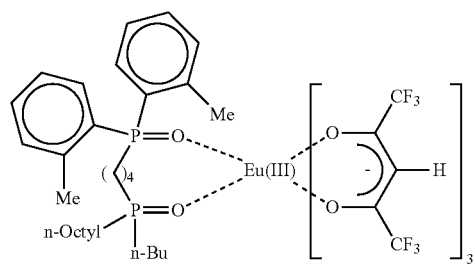

-continued

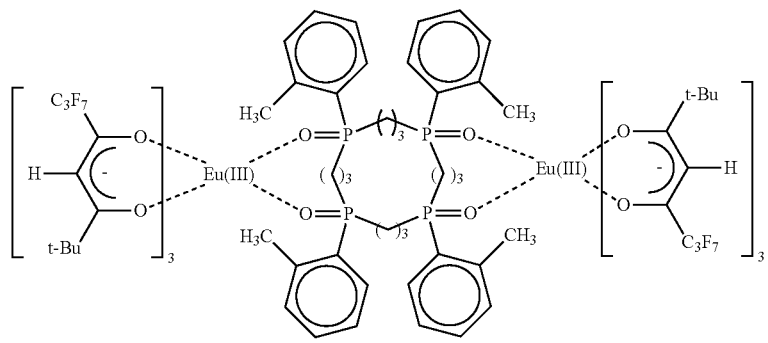

(1-56)

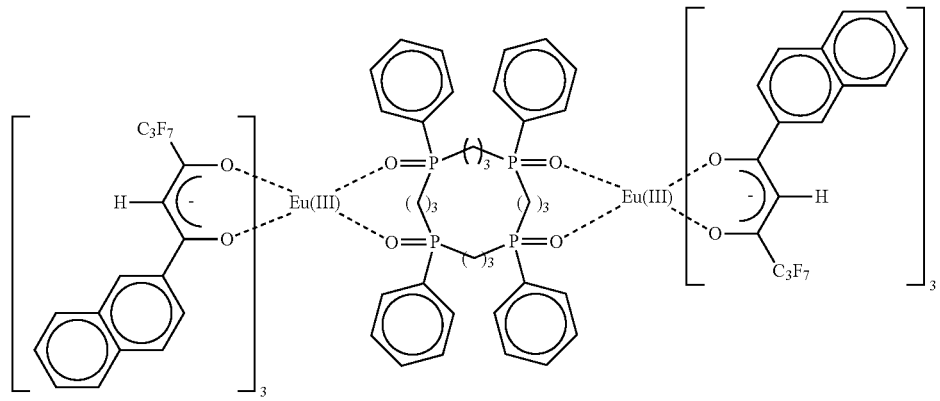

(1-57)

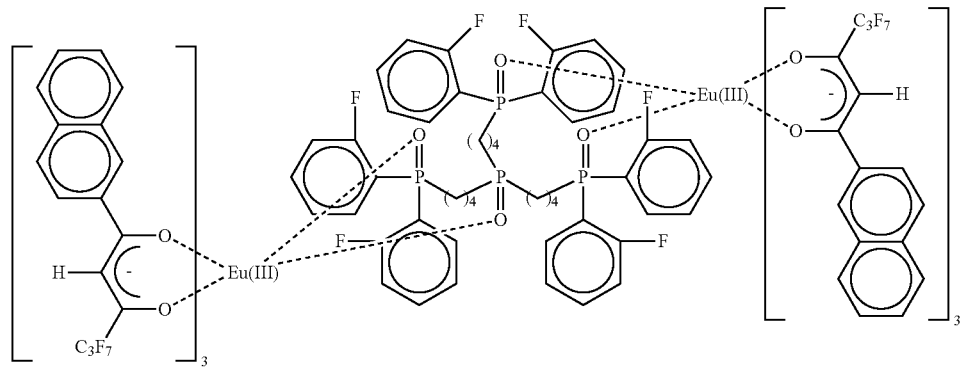

(1-58)

<Nonionic Compound>

The light wavelength conversion medium according to the embodiment further comprises a nonionic compound substitutable for the nonionic ligand contained in the complex. Consequently, even if the nonionic ligand is eliminated from the complex molecule, it is presumed that the ligand field in the complex can be maintained to keep the properties of the complex at a high level because the substitutable nonionic compound is present near the complex. Since the nonionic compound may replace the nonionic ligand, it may be impossible to clearly distinguish them from each other. Even in that case, however, the total amount of the nonionic compound and the nonionic ligand is constant and is necessarily larger than the stoichiometric amount based on the rare earth ion contained in the light wavelength conversion medium.

The nonionic compound can be selected from the same substances as the above-described nonionic ligands. The nonionic compound may be the same as or different from the nonionic ligand contained in the complex incorporated in the light wavelength conversion medium. Further, two or more different nonionic compounds can be mixed to use. However, if the ligand exchange occurs, the complex may change in properties such as emission wavelength. In view of that, the nonionic compound is preferably identical with the nonionic ligand. On the other hand, it is possible to reduce cost if the nonionic compound and nonionic ligand have different structure. For example, if the complex comprises diphosphine oxide as nonionic ligand, it is possible to produce a light wavelength conversion medium inexpensively using monophosphine oxide as nonionic compound.

There are no particular restrictions on the amount of the nonionic compound as long as the conversion medium of the embodiment comprises it. For example, the medium comprises the nonionic compound in an amount of preferably 0.01 to 100 molar equivalent, more preferably 0.1 to 50 molar equivalent based on the rare earth ion. Specifically, if the complex is represented by the formula (1), for example, the complex molecule of the formula (1) contains the nonionic ligand in an amount of p mol (p equivalent based on the rare earth ion) and accordingly the conversion medium comprises the nonionic ligand and the nonionic compound in a total amount of p+0.01 to p+100 mol. Typically, it is preferred for p in the formula (1) to be 1 and accordingly the medium preferably comprises the nonionic ligand and the nonionic compound in a total amount of 1.01 to 101 equivalent.

In view of the ligand exchange, the rare earth ion and the nonionic ligand are preferably positioned at a short mutual distance from each other. Therefore, the medium preferably comprises the rare earth ion in a high concentration. On the other hand, however, if the concentration of the rare earth ion, namely, that of the complex is too high, the emission intensity may be lowered by concentration quenching. In consideration of those, the medium comprises the rare earth ion preferably in an amount of $1 \times 10^{-7}$ to 1 mol/l.

<Polymer or Solvent>

In the light wavelength conversion medium according to the embodiment, the complex and the nonionic compound are dissolved or dispersed in a polymer or a solvent. The polymer or solvent used here preferably has such high transparency that light incident into the conversion medium can efficiently reach to the complex and also that luminescence given off from the complex can be efficiently emitted to the outside.

Examples of the polymer include: polyacrylic acid, polymethacrylic acid, polystyrene, polycarbonate, polyester, polyolefin, polyvinyl chloride, polyvinyl acetate, and copolymers thereof. Among them, preferably used polymers are poly-methylmethacrylate, polycarbonate, polystyrene, acrylic resin, diethyleneglycol bisarylcarbonate, poly-4-methylpentene-1, alicyclic polyolefin resin, alicyclic acrylic resin, and copolymers thereof.

The complexes having phosphine oxide ligands and β-diketonate ligands are stable even under strongly acidic conditions, and hence tend to keep high durability even if dispersed or dissolved in acidic polymers. Accordingly, acidic polymers can be adopted as the above polymer. They are, for example, polymers having carboxy groups or sulfonic acid groups. Examples thereof include: alkyd polymers, such as, linseed oil-modified maleic acid alkyd polymer and acrylic-modified alkyd polymer; polyacrylic acid; and polystyrene sulfonic acid. In addition, acidic anion-exchange resins are also employable as the polymer.

Examples of the solvent include: a) esters, such as, ethyl acetate and butyl acetate; b) alcohols, such as, methyl alcohol, ethyl alcohol and propyl alcohol; c) glycols, such as, ethylene glycol and propylene glycol; d) ketones, such as, acetone and dimethyl ketone; e) sulfoxides, such as, dimethyl sulfoxide; f) alkanes, such as, hexane and octane; g) halogenated alkanes, such as, pentafluorocyclohexane and carbon tetrachloride; and mixtures thereof. They are preferably used.

<Light Wavelength Conversion Medium-Forming Composition and Light Wavelength Conversion Medium-Producing Process Using the Same>

The light wavelength conversion medium according to the embodiment comprises the above-described complex, nonionic compound and polymer or solvent. The composition for forming the medium comprises those components and other solvents or additives according to necessity.

As an embodiment of the light wavelength conversion medium-forming composition (hereinafter, often simply referred to as "composition"), it may comprise a solvent in addition to the above complex, nonionic compound and polymer. The solvent can be selected properly from known organic solvents and the like. Specifically, examples thereof include: esters, such as, ethyl acetate; fluorinated aliphatic hydrocarbons, such as, perfluoropentane; aromatic hydrocarbons, such as, toluene and xylene; and alcohols, such as, ethanol, methanol, isopropanol, and butanol. The composition is applied for coating a substrate or soaked in a fibrous support, and then the solvent is evaporated by heating or the like so that the light wavelength conversion medium can be formed on the substrate or the support. The substrate can be made of any desired material, such as, paper, plastics, cloth, nonwoven fabric or ceramics. In addition, there are no particular restrictions on the coating method. When the conversion medium is used as a security medium, a specific image is generally printed or transferred onto the substrate to form a distinctive mark.

As another embodiment of the conversion medium, the composition may comprise the above complex, nonionic compound and polymer but not a solvent. If a thermosetting polymer, which is liquid at room temperature but solidifies when heated, is adopted as the polymer, the conversion medium can be formed by heating the composition after it is applied or soaked. In another way, if a thermoplastic polymer, which is liquid at a high temperature but solidifies at room temperature, is adopted as the polymer, the conversion medium can be formed by cooling the composition after it is applied or soaked at a high temperature. In still another way, if a crosslinking agent or polymerization initiator is incorporated in the composition, the conversion medium can be formed by hardening the composition after it is applied or soaked.

Further, the composition may be laid and solidified on a substrate or in a container, and then peeled off to form a supportless conversion medium mold (fluorescent film).

In a process for preparing the composition, it is general to incorporate a rare earth complex and an additive nonionic compound into a polymer or the like. However, instead of that, a rare earth ion-containing salt and a nonionic compound in an excess amount may be incorporated into a polymer, so as to form a rare earth complex in the composition.

According to necessity, the composition may comprise additives, such as, surfactant, antifoaming agent, antiseptic agent and pH adjuster. When used for security media, the composition according to the embodiment is generally preferred to have low visibility and hence to be colorless and transparent under visible light. However, if necessary, dyes or pigments can be incorporated therein. Further, the rare earth complex can be enclosed in microcapsules so as to keep stably.

The following examples will explain the embodiment, but they by no means restrict the embodiment.

Example 1

Figure 2:
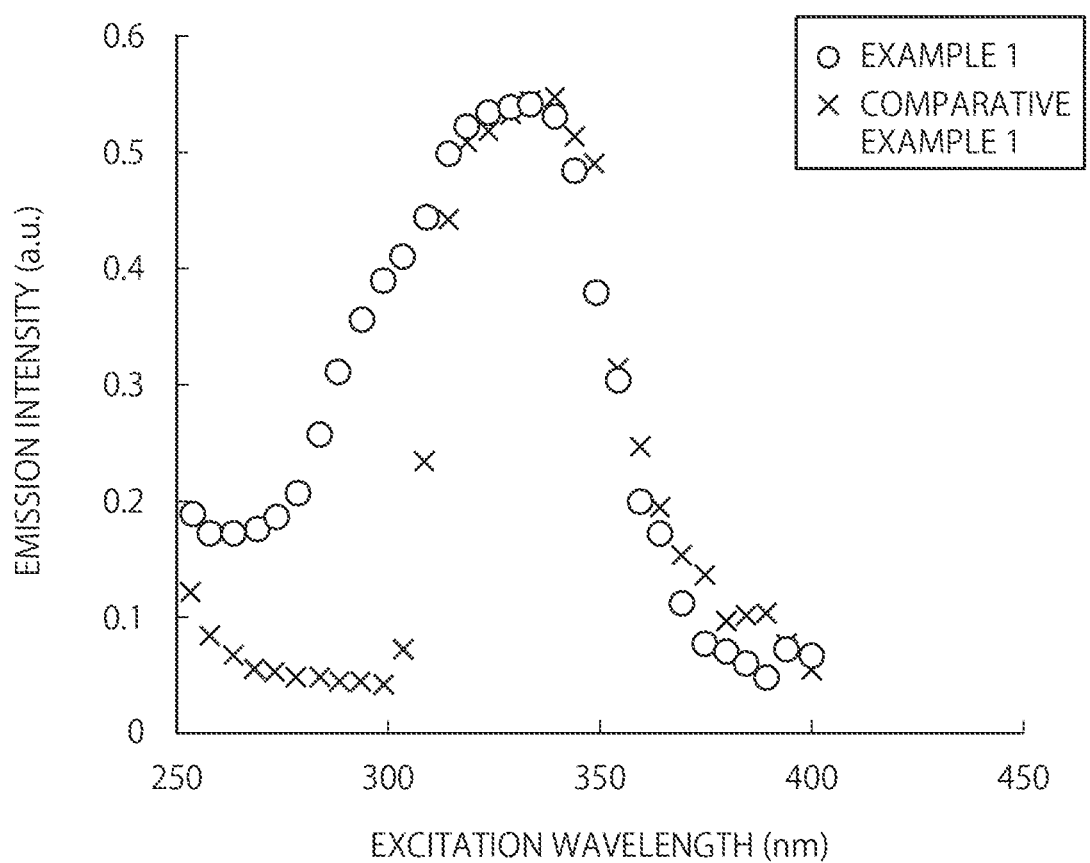
FIG. 2 shows action spectra of the light wavelength conversion media in Example 1 and Comparative example 1.

The rare earth complex represented by the formula (1-3) was so dissolved in an acrylic resin that the concentration thereof might be 10 wt %, and further the diphosphine dioxide compound represented by the formula (A) was incorporated in an amount of 1 molar equivalent to prepare a composition, which is then molded and hardened to produce a fluorescent film. The action spectra of the obtained fluorescent film were measured, and the results are shown in FIGS. 1 and 2.

Comparative Example 1

The procedure of Example 1 was repeated except for not incorporating the diphosphine dioxide compound of the formula (A), to produce a fluorescent film. The excitation and action spectra of the obtained fluorescent film were measured, and the results are shown in FIGS. 1 and 2.

<Evaluation>

As shown in FIGS. 1 and 2, the fluorescent film of Example 1 shows stronger emission intensity and has a larger quantum efficiency in a short UV wavelength region than that of Comparative example 1.

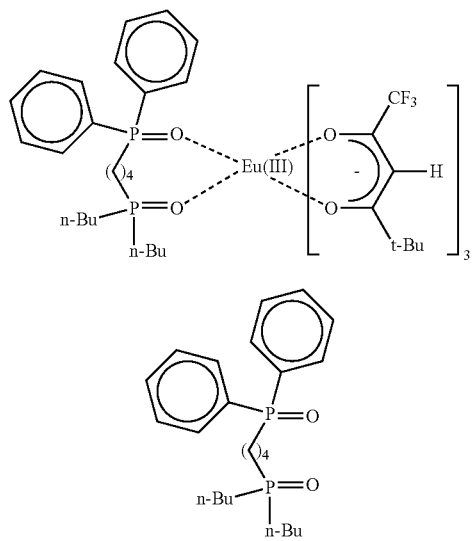

Example 2

Figure 3:
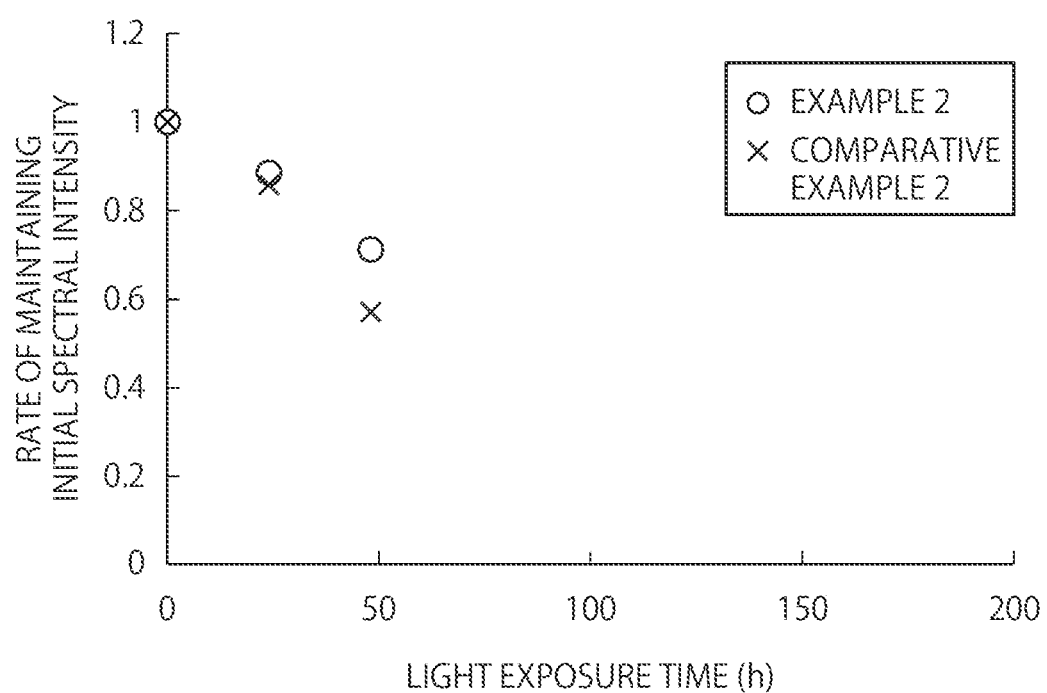
FIG. 3 is a graph showing durability of the light wavelength conversion medium according to the embodiment.

The rare earth complex represented by the formula (1-4) was so dissolved in an acrylic resin that the concentration thereof might be 10 wt %, and further the diphosphine dioxide compound represented by the formula (A) was incorporated in an amount of 1 molar equivalent to produce a fluorescent film. The fluorescent film was exposed to 70000 lux of light, and then the emission spectral intensities were measured at exposure times of 0, 24, 48 and 168 hours. The results are shown in FIG. 3, in which the intensities are expressed in terms of relative values on the basis that the intensity at an exposure time of 0 is regarded as 1.

Comparative Example 2

The rare earth complex represented by the formula (1-13) was so dissolved in an acrylic resin that the concentration thereof might be 10 wt %, to produce a fluorescent film. In the same manner as in Example 2, the emission spectral intensities of the obtained film were measured at various exposure times. The results are shown in FIG. 3.

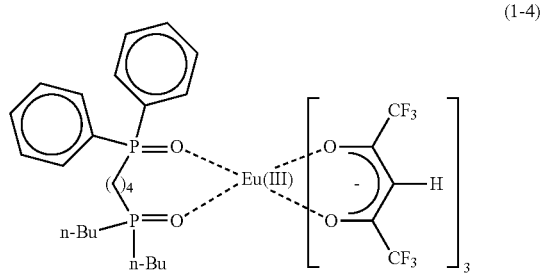

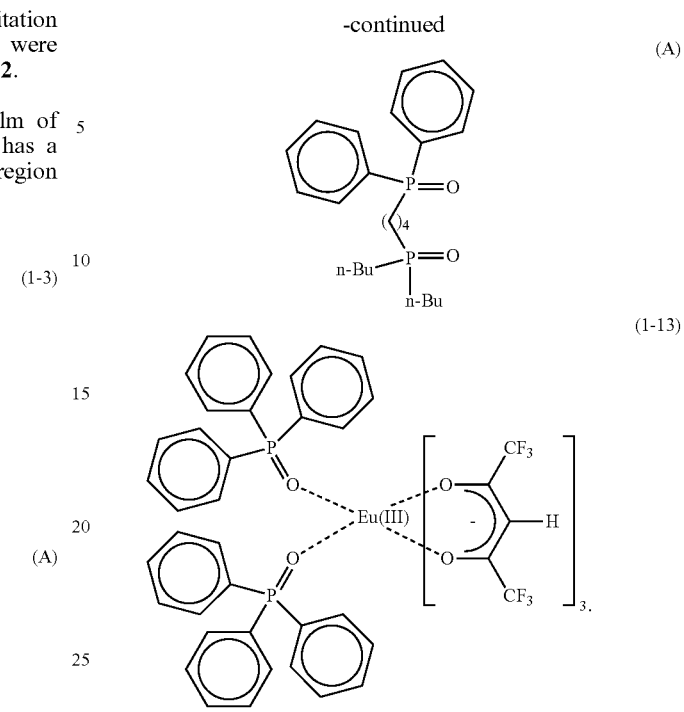

<Evaluation on Durability>

The medium of Comparative example 2, which does not comprise a nonionic compound, rapidly deteriorates in emission intensity when exposed to light, and hence tends to have poor durability.

<Evaluation on Transparency>

The fluorescent films of Examples 1, 2, Comparative examples 1 and 2 were visually evaluated on transparency. Those of Examples 1 and 2 were transparent, and not a cloud or fog was to be found. On the other hand, the fluorescent film of Comparative example 1 was slightly fogged and the film of Comparative example 2 was cloudier than that of Comparative example 1. Such difference in transparency is presumed to depend on the solubility, and accordingly it is suggested that the excess presence of phosphine dioxide tends to improve the solubility of the complex.

<Evaluation on Variation of Emission Intensity in Plane>

If the complex has insufficient solubility, the obtained fluorescent film shows a large variation of emission intensity in plane even if exposed to excitation light under the same conditions. On each of the fluorescent films of Examples 1, 2, Comparative examples 1 and 2, a region of 3-cm square was located and then the region was divided into 9 small regions of 1-cm square. Subsequently, each 1-cm square region was individually excited with light at 330 nm, and then the spectral area of the emission spectrum was measured so as to determine the emission intensity variation depending on each region. As a result, the films of Examples 1, 2, Comparative examples 1 and 2 showed variations of less than 3%, less than 3%, about 10% and about 30%, respectively.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The

The invention claimed is:

1. A light wavelength conversion medium comprising:
   a rare earth complex comprising a rare earth ion and a nonionic ligand,
   a nonionic compound substitutable for said nonionic ligand, and
   a polymer or a solvent,
   wherein:
      the total molar amount of said nonionic compound and said nonionic ligand is larger than the stoichiometric molar amount required to achieve maximum coordination of the rare earth ion contained in said light wavelength conversion medium; and
      said nonionic ligand and said nonionic compound are selected from the group consisting of phosphine oxide compounds, sulfoxide compounds, and amine compounds.

2. The light wavelength conversion medium according to claim 1, wherein said nonionic ligand and said nonionic compound have an identical structure.

3. The light wavelength conversion medium according to claim 1, wherein said nonionic ligand and said nonionic compound have a different structure.

4. The light wavelength conversion medium according to claim 1, wherein said nonionic ligand and said nonionic compound are represented by formula (L-1-1), (L-1-2), (L-1-3), (L-1-4), (L-2-1), (L-2-2), (L-3-1) or (L-3-2):

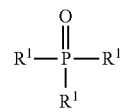
(L-1-1)

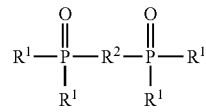
(L-1-2)

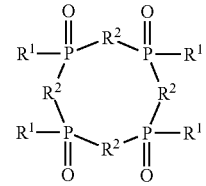
(L-1-3)

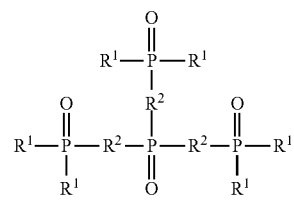
(L-1-4)

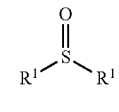
(L-2-1)

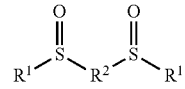
(L-2-2)

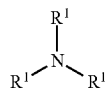
(L-3-1)

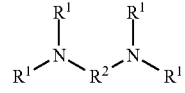
(L-3-2)

wherein:
   each $R^1$ is independently a substituted or unsubstituted alkyl group or a substituted or unsubstituted aryl group provided that two $R^1$s connecting to a phosphorus, sulfur or nitrogen atom may be linked with each other to form an alicyclic or aromatic ring structure, and
   each $R^2$ is a substituted or unsubstituted alkylene or a substituted or unsubstituted arylene group.

5. The light wavelength conversion medium according to claim 4, wherein said nonionic ligand and said nonionic compound are represented by formula (L-1-1), (L-1-2), (L-1-3), or (L-1-4).

6. The light wavelength conversion medium according to claim 4, wherein $R^1$ is selected from the group consisting of an alkyl group having 3 to 10 carbon atoms, a fluoroalkyl group having 3 to 10 carbon atoms, an aryl group having 5 to 20 carbon atoms, an fluoroaryl group having 5 to 20 carbon atoms, an alkylaryl group having 6 to 20 carbon atoms, an alkoxylaryl group having 6 to 20 carbon atoms, a heteroaryl group having 5 to 20 carbon atoms and a fluoroaryl group having 6 to 20 carbon atoms.

7. The light wavelength conversion medium according to claim 4, wherein at least one $R^1$ is a substituted phenyl having a substituent in ortho-position.

8. The light wavelength conversion medium according to claim 1, wherein said nonionic ligand and said nonionic compound are diphosphine dioxides.

9. The light wavelength conversion medium according to claim 1, wherein said nonionic ligand and said nonionic compound are tetraphosphine tetra-oxides.

10. The light wavelength conversion medium according to claim 1, wherein said rare earth ion is europium (III) ion or terbium (III) ion.

11. The light wavelength conversion medium according to claim 1, wherein said rare earth complex comprises a ß-diketonate ligand.

12. The light wavelength conversion medium according to claim 11, wherein said ß-diketonate ligand contains a halogenated hydrocarbon group.

13. The light wavelength conversion medium according to claim 1, wherein said polymer is selected from the group consisting of polyacrylic acid, polymethacrylic acid, polystyrene, polycarbonate, polyester, polyolefin, polyvinyl chloride, polyvinyl acetate, and copolymers thereof.

14. The light wavelength conversion medium according to claim 1, wherein said polymer is selected from the group consisting of polymethylmethacrylate, polycarbonate, polystyrene, acrylic resin, diethyleneglycol bisarylcarbonate, poly-4-methylpentene-1, alicyclic polyolefin resin, alicyclic acrylic resin, and copolymers thereof.

15. The light wavelength conversion medium according to claim 1, wherein said solvent is selected from the group consisting of esters, alcohols, glycols, ketones, sulfoxides, alkanes, halogenated alkanes, and mixtures thereof.

16. The light wavelength conversion medium according to claim 1, wherein said nonionic compound is contained in an amount of 0.01 to 100 molar equivalent based on said rare earth ion.

17. The light wavelength conversion medium according to claim 1, wherein said rare earth ion is contained in an amount of $1\times10^{-7}$ to 1 mol/l.

18. The light wavelength conversion medium according to claim 1, said rare earth complex is represented by the following formula (1):

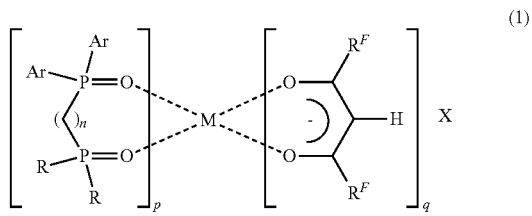

wherein
each Ar is independently an aryl group,
each R is independently an alkyl group,
each $R^F$ is independently a halogenated hydrocarbon group,
n is an integer of 3 to 5,
p is an integer of 1 or 2,
q is an integer of 1 to 3,
M is a rare earth ion, and
X is absent when q is 3 but is an anion having a valence of 3-q when q is 1 or 2.

19. The light wavelength conversion medium according to claim 18, wherein p is 1 and said light wavelength conversion medium comprises the nonionic ligand and the nonionic compound in a total amount of 1.01 to 101 equivalent based on said rare earth ion.

20. A light wavelength conversion medium-forming composition comprising:
   a rare earth complex comprising a rare earth ion and a nonionic ligand,
   a nonionic compound substitutable for said nonionic ligand, and
   a polymer or a solvent,
   wherein:
   the total molar amount of said nonionic compound and said nonionic ligand is larger than the stoichiometric molar amount required to achieve maximum coordination of the rare earth ion contained in said light wavelength conversion medium; and
   said nonionic ligand and said nonionic compound are selected from the group consisting of phosphine oxide compounds, sulfoxide compounds, and amine compounds.

* * * * *